US006441542B1

(12) United States Patent
Hush et al.

(10) Patent No.: US 6,441,542 B1
(45) Date of Patent: Aug. 27, 2002

(54) CATHODE EMITTER DEVICES, FIELD EMISSION DISPLAY DEVICES, AND METHODS OF DETECTING INFRARED LIGHT

(75) Inventors: Glen Hush; Dean Wilkinson; Zhong-Yi Xia, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/358,863

(22) Filed: Jul. 21, 1999

(51) Int. Cl.[7] .......................... H01L 29/06; H01J 1/308; H01J 1/307

(52) U.S. Cl. ....................... 313/309; 313/496; 313/310; 257/10

(58) Field of Search ................................ 313/495, 496, 313/497, 498, 499, 501, 507, 523, 309, 310, 311, 336; 250/214 VT; 257/10, 11, 442; 315/169.1

(56) References Cited

U.S. PATENT DOCUMENTS

| | | | | |
|---|---|---|---|---|
| 3,814,968 A | | 6/1974 | Nathanson et al. | 313/95 |
| 3,845,296 A | * | 10/1974 | Schnitzler | 250/214 VT |
| 5,079,610 A | * | 1/1992 | Norton | 257/442 |
| 5,212,426 A | | 5/1993 | Kane | 315/169.1 |
| 5,457,356 A | | 10/1995 | Parodos | 313/505 |
| 5,804,833 A | * | 9/1998 | Stettner et al. | 257/10 |
| 5,814,873 A | * | 9/1998 | Konuma | 257/449 |

OTHER PUBLICATIONS

Article: The Big Picture: Camcorders, "Sony Turns Up the Lights on NightShot Camcorder Technology", JEI Sep. 1998, 1 page.

EOS Technical Journal, Hughes Aircraft, Spring 1996, pp. 1–40.

Thomas R., et al., "Fabrication and Some Applications of Large–Area Silicon Field Emission Arrays", Solid–State Electronics, 1974, vol. 17, pp. 155–163.

Clark, D., et al., "Design and Performance of a 486 ×640 Pixel Platinum Silicide IR Imaging System", SPIE vol. 1689 Infrared Imaging Systems (1992), pp. 101–107.

Ajisawa, A., et al., Infrared Technology and Applications XXIII, "256×256 LWIR FPAs Using MBE Grown HgCdTe on Si Substrates", SPIE vol. 3061 (Apr. 1997), pp. 248–255.

* cited by examiner

*Primary Examiner*—Nimeshkumar D. Patel
*Assistant Examiner*—Karabi Guharay
(74) *Attorney, Agent, or Firm*—Wells St. John P.S.

(57) ABSTRACT

In one aspect, a cathode emitter device comprises an infrared receptor having an n-type doped semiconductive region overlying a p-type doped semiconductive region. The n-type and p-type doped regions of the receptor join at a junction diode. The cathode emitter device further comprises an array of cathode emitter tips in electrical connection with the n-type region of the infrared receptor. In other aspects, the invention encompasses field emission display devices, such as, for example, devices comprising the above-described cathode emitter device. In yet other aspects, the invention encompasses methods of utilizing cathode emitter devices, such as, for example, methods of utilizing the above-described cathode emitter device.

53 Claims, 4 Drawing Sheets

CATHODE EMITTER DEVICES, FIELD EMISSION DISPLAY DEVICES, AND METHODS OF DETECTING INFRARED LIGHT

PATENT RIGHTS STATEMENT

This invention was made with government support under Contract No. DABT63-94-C-0012 awarded by Advanced Research Projects Agency (ARPA). The Government has certain rights in this invention.

TECHNICAL FIELD

The invention pertains to cathode emitter devices. In particular applications, the invention pertains to devices configured to detect infrared radiation, as well as to methods of utilizing such devices.

BACKGROUND OF THE INVENTION

Many applications are known wherein it is desired to detect and/or image infrared radiation. Exemplary applications include thermo-imaging devices, such as cameras, utilized in night-vision accessories and other surveillance equipment. For instance, infrared radiation can be utilized by surveillance equipment to detect and image objects that are hotter than their surrounding environment. Such utilization takes advantage of the fact that objects naturally emanate infrared radiation when heated (so-called blackbody radiation).

Among the known methods for detecting and/or imaging infrared radiation are methods which take advantage of sensitivity of p-type silicon to infrared radiation. For instance, U.S. Pat. No. 3,814,968 describes a field emission display apparatus comprising an array of lower doped p-type cathode emitter devices in electrical contact with a higher doped p-type semiconductive material. The apparatus is configured such that when the higher doped p-type material is exposed to infrared radiation, the electrical properties of the material change and cause one or more electrons to be emitted from the lower doped p-type cathode array. Such electrons then impact a phosphor spaced from the array to cause a visually detectable image to occur.

A difficulty associated with devices such as that disclosed in U.S. Pat. No. 3,814,968 can be a lack of sensitivity of the semiconductive material to radiation having relatively long wavelengths, such as wavelengths greater than or equal to about 2,500 angstroms. For instance, if p-type doped silicon (with the dopant provided to a concentration of greater than or equal to $1\times10^{18}$atoms/$cm^3$) is utilized as the semiconductive material, it will typically be unable to detect infrared photons at wavelengths greater than about 1,200nanometers. This causes complications for utilizing silicon detectors because many objects are not hot enough to generate a significant amount of infrared radiation having wavelengths less than or equal to 1,200 nanometers. It would therefore be desirable to develop improved methods for detecting infrared radiation.

SUMMARY OF THE INVENTION

In one aspect, a cathode emitter device comprises an infrared receptor having an n-type doped semiconductive region overlying a p-type doped semiconductive region. The n-type and p-type doped regions of the receptor join at a junction diode. The cathode emitter device further comprises an array of cathode emitter tips in electrical connection with the n-type region of the infrared receptor.

In another aspect, the invention encompasses a cathode emitter device. The device includes a substrate comprising an n-type doped region overlying a p-type doped region, with the n-type and p-type doped regions joining at a junction diode. The device further comprises an array of cathode emitter tips in electrical connection with the junction diode, and a receptor assembly beside the junction diode. The receptor assembly comprises a material different from that of the substrate, and comprises a p-type doped region and n-type doped region of said material. The p-type doped region of the receptor assembly contacts the p-type doped region of the substrate, and the n-type doped region of the receptor assembly contacts the n-type doped region of the substrate.

In other aspects, the invention encompasses field emission display devices, such as, for example, devices comprising the above-described cathode emitter device. In yet other aspects, the invention encompasses methods of utilizing cathode emitter devices, such as, for example, methods of utilizing the above-described cathode emitter device.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses devices configured for detecting infrared radiation, and in particular embodiments encompasses devices configured to detect light having a wavelength of greater than or equal to about 2,500 nanometers.

Figure 1:
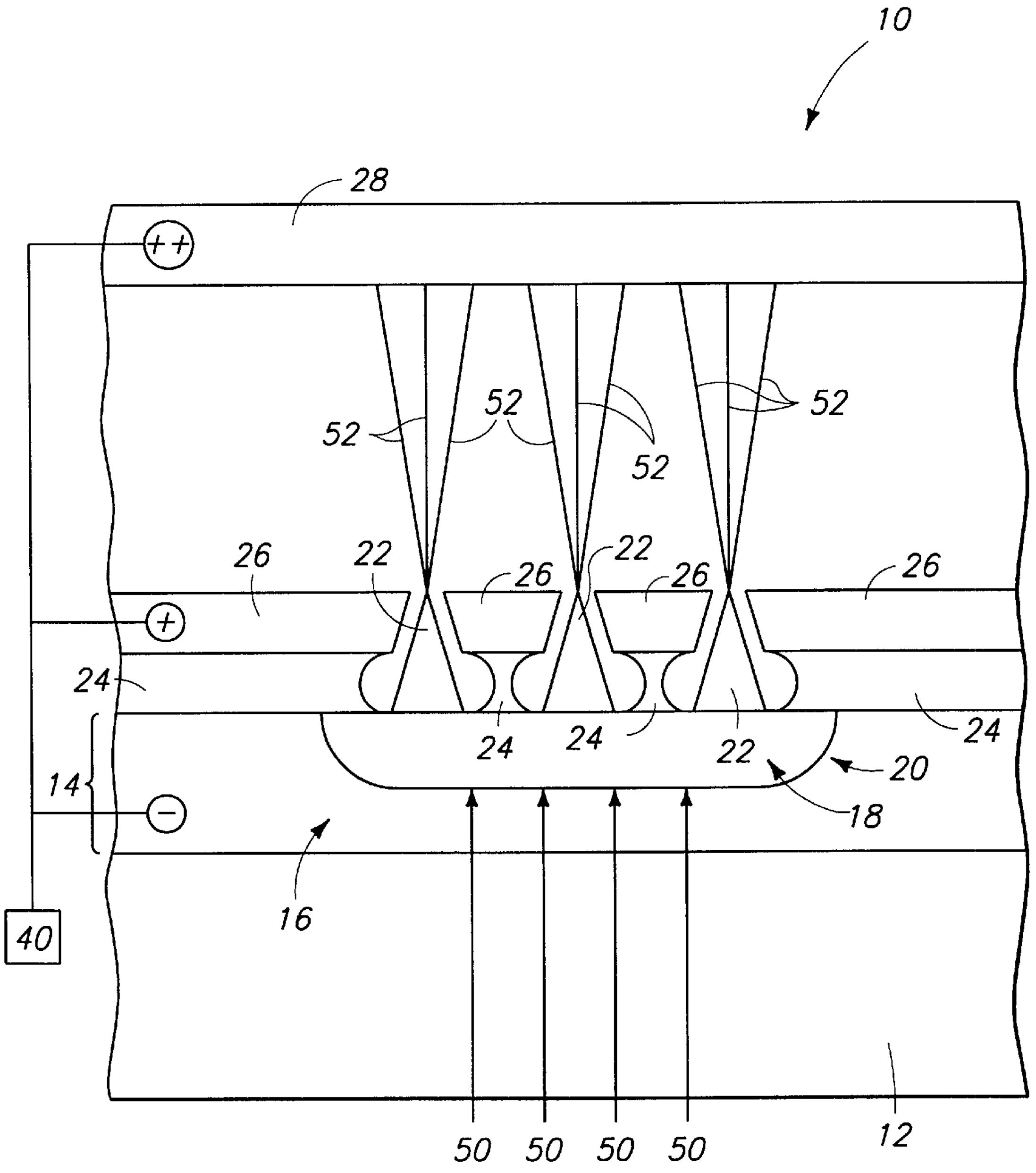
FIG. 1 is a diagrammatic, schematic, cross-sectional, fragmentary view of a first embodiment apparatus encompassed by the present invention.

A first embodiment display device 10 encompassed by the present invention is illustrated in FIG. 1. Device 10 includes a base substrate 12 which can comprise, for example, monocrystalline silicon. To aid in interpretation of the claims that follow, the term "semiconductive substrate" is defined to mean any construction comprising semiconductive material, including, but not limited to bulk semiconductive materials, such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A layer 14 is formed over substrate 12. Layer 14 comprises a material having p-type doped portion 16 and an n-type doped portion 18. The material of layer 14 is preferably chosen such that p-type doped portion 16 has electrical characteristics which are more readily altered by light having relatively long wavelengths (such as, for example, wavelengths of greater than or equal to about 2,500 nanometers) than are the electrical characteristics of p-type doped silicon. An exemplary preferred material for layer 14 is Hg—Cd—Te. Such material can be formed by, for example, chemical vapor deposition or sputter deposition. If layer 14 comprises Hg—Cd—Te, p-type doped portion 16 is preferably doped to a concentration of at least about $2.3\times10^{16}$ atoms/cm$^3$, and n-type doped portion 18 is preferably doped to a concentration of at least about $6\times10^{15}$ atoms/cm$^3$. A suitable p-type dopant for Hg—Cd—Te is boron, and suitable n-type dopants include phosphorus and arsenic. The Hg—Cd—Te preferable comprises $Hg_{(1-x)}Cd_{(x)}Te$, wherein x is 0.3. In a particular construction, layer 14 can consist essentially of doped Hg—Cd—Te. A junction diode 20 is defined by an interface of p-type doped portion 16 and n-type doped portion 18.

Another exemplary material which can be incorporated into layer 14 is platinum silicide. If layer 14 comprises platinum silicide, portion 16 is preferably n-type doped silicon and layer 18 preferably consists essentially of platinum silicide.

In particular embodiments, layer 14 can comprise predominately either monocrystalline silicon or polycrystalline silicon, and can, accordingly comprise a same material as substrate 12. In such embodiments, the silicon materials of substrate 12 and layer 14 can together define a silicon block.

An array of cathode emitter tips 22 is formed over material 14 and in electrical connection with n-type doped portion 18. In the shown embodiment, cathode emitter tips 22 are in physical connection with n-type doped portion 18. In other embodiments (not shown) another material (such as, for example, an electrically conductive material) can be provided between cathode emitter tips 22 and n-type doped portion 18.

A dielectric material 24 is formed at a base of cathode emitter tips 22, and a conductive extraction grid 26 is formed at an elevational level of the tip portions of cathode emitter tips 22. Dielectric material 24 and grid 26 can be formed in accordance with conventional methods.

A phosphor-coated plate 28 is provided in spaced relation relative to the array of cathode emitter tips 22.

A power source 40 is provided to charge phosphor-coated plate 28, extraction grid 26, and layer 14. In alternative embodiments in which a conductive material is provided between the array of cathode emitter tips and n-type portion 18, such conductive material can be charged instead of, or in addition to, layer 14.

In operation, infrared light 50 penetrates silicon substrate 12 and impacts p-type do de portion 16 of layer 14 to change electrical characteristics of the p-type doped portion. Such change in electrical characteristics is propagated through junction diode 20 and n-type doped portion 18 to cause electrons 52 to be emitted from cathode emitter tips 22. Electrons 52 impact phosphor of plate 28 to cause an image to be displayed.

An advantage of the present invention over the prior art is that if the material of layer 14 is chosen to be more sensitive to light with relatively long wavelengths (such as, for example, light having wavelengths of greater than or equal to about 2,500 nanometers) than is p-type doped silicon, an apparatus of the present invention can be utilized for detecting and/or imaging radiation that could not be detected with p-type silicon alone. Such radiation can include infrared radiation naturally emanating from warm-blooded creatures.

A second embodiment apparatus 100 encompassed by the present invention is described with reference to FIG. 2. Apparatus 100 comprises a substrate 112 having a p-type doped portion 116 and an n-type doped portion 118, with a junction diode 120 defined by the interface of portions 116 and 118. Substrate 112 can comprise, for example, silicon, and is preferably formed to a thickness "y" of less than 10 microns. If substrate 112 comprises silicon, the silicon can be in one or more of a monocrystalline or polycrystalline form. Such silicon material can comprise a p-type doped portion 116 having a dopant concentration of at least about $1\times10^{18}$ atoms/cm$^3$, and an n-type doped portion 118 having a dopant concentration of at least about $1\times10^{18}$ atoms/cm$^3$.

An array of cathode emitter tips 122 is formed over substrate 112 and in electrical connection with n-type doped portion 118. In the shown embodiment, cathode emitter tips 122 are in physical contact with n-type doped portion 118. In other embodiments (not shown) another material (such as, for example, a conductive material) can be placed between emitter tips 122 and n-type doped portion 118.

A dielectric material 124 is formed at an elevational level of lower portions of emitter tips 122 and a conductive extraction grid 126 is formed at an elevational level of the tip portions of the emitter tips 122.

A phosphor-coated plate 128 is provided to be spaced from cathode emitter tips 122. A power source 140 is provided to charge to phosphor-coated plate 128, extraction grid 126 and n-type doped portion 118. In alternative embodiments wherein a conductive material is provided between cathode emitter tips 122 and n-type doped portion 118, a charge can be provided within such conductive material, in addition to, or instead of, n-type doped portion 118.

An infrared sensitive structure 170 is provided in electrical connection with p-type doped region 112 and n-type doped region 118, with structure 170 configured to function as a receptor for receiving relatively long wavelength infrared radiation (such as infrared radiation having wavelengths greater than or equal to about 2500 nanometers). In the shown embodiment, receptor 170 comprises a material 172 having a p-type doped portion 174 and an n-type doped portion 176. Material 172 is preferably chosen to have electrical characteristics which are more readily altered by light having a wavelength of about 2,500 nanometers or greater than are the electrical characteristics of p-type doped region 112. Material 172 can comprise, for example, platinum silicide or Hg—Cd—Te, and can be formed by methods described above with reference to layer 14 of FIG. 1. In particular embodiments, material 172 can consist essentially of conductively doped platinum silicide or doped Hg—Cd—Te. In the shown embodiment, material 172 physically contacts p-type region 116 and n-type region 118 of substrate 112. In other embodiments (not shown) one or more materials (such as, for example, conductive materials) can be provided between material 172 and one or both of p-type region 116 and n-type region 118.

In operation, light 190 passes through substrate 112 to strike receptor 170 and causes an electrical characteristic of material 172 to be altered. The alteration in the electrical characteristic of material 172 causes an alteration in the electrical properties of one or both of p-type doped portion 116 and n-type doped portion 118, to cause electrons 192 to be emitted from cathode emitter tips 122. Electrons 192 strike phosphor-coated plate 128 to cause an image to be displayed.

Device 100, like the above-described device 10, can be advantageous over prior art devices, in that device 100 can be more sensitive to light having relatively long wavelengths (such as, for example, wavelengths of greater than or equal to about 2,500 nanometers) than are prior art devices.

Figure 2:
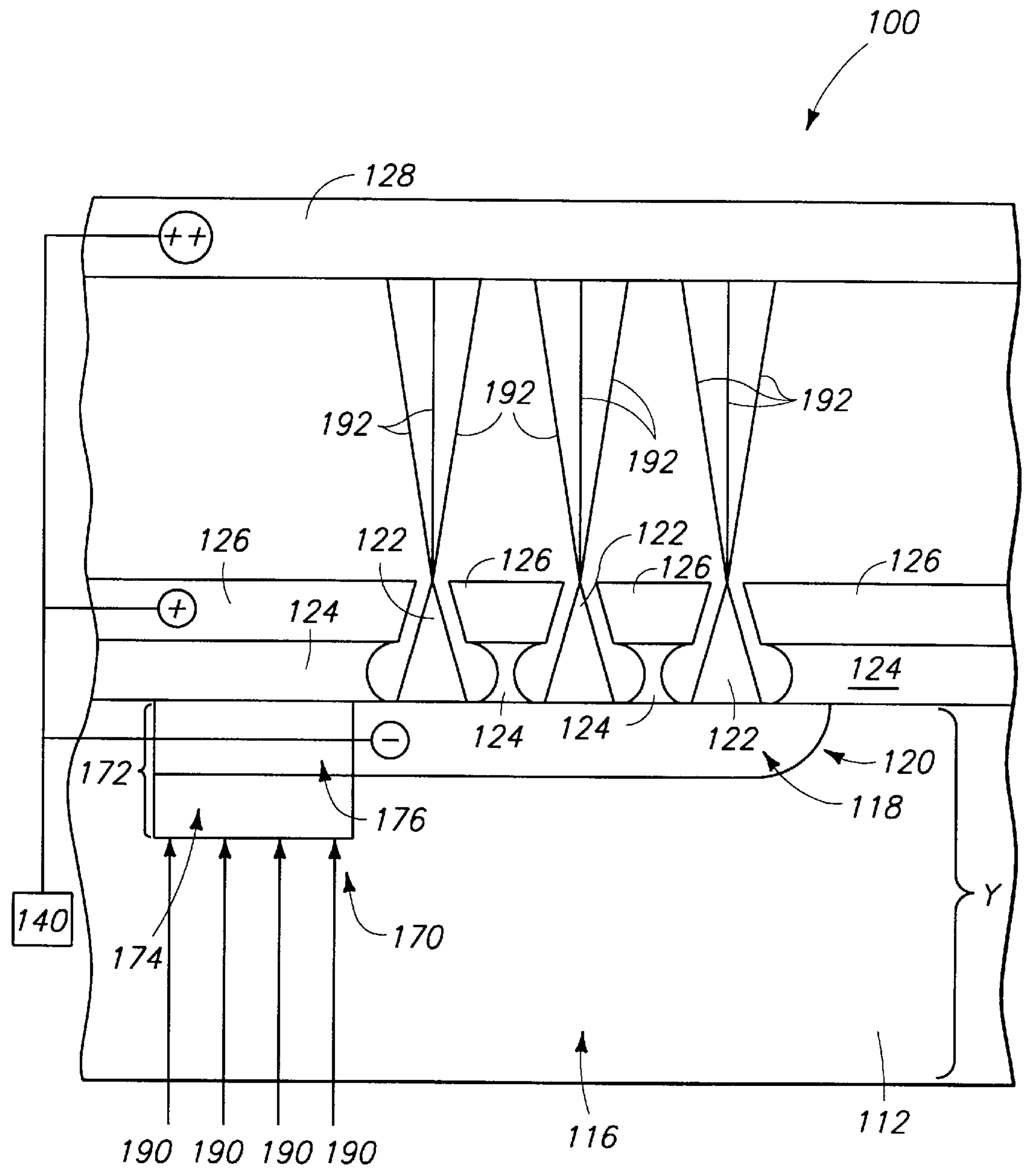
FIG. 2 is a diagrammatic, fragmentary, schematic, cross-sectional view of a second embodiment apparatus encompassed by the present invention.
Figure 3:
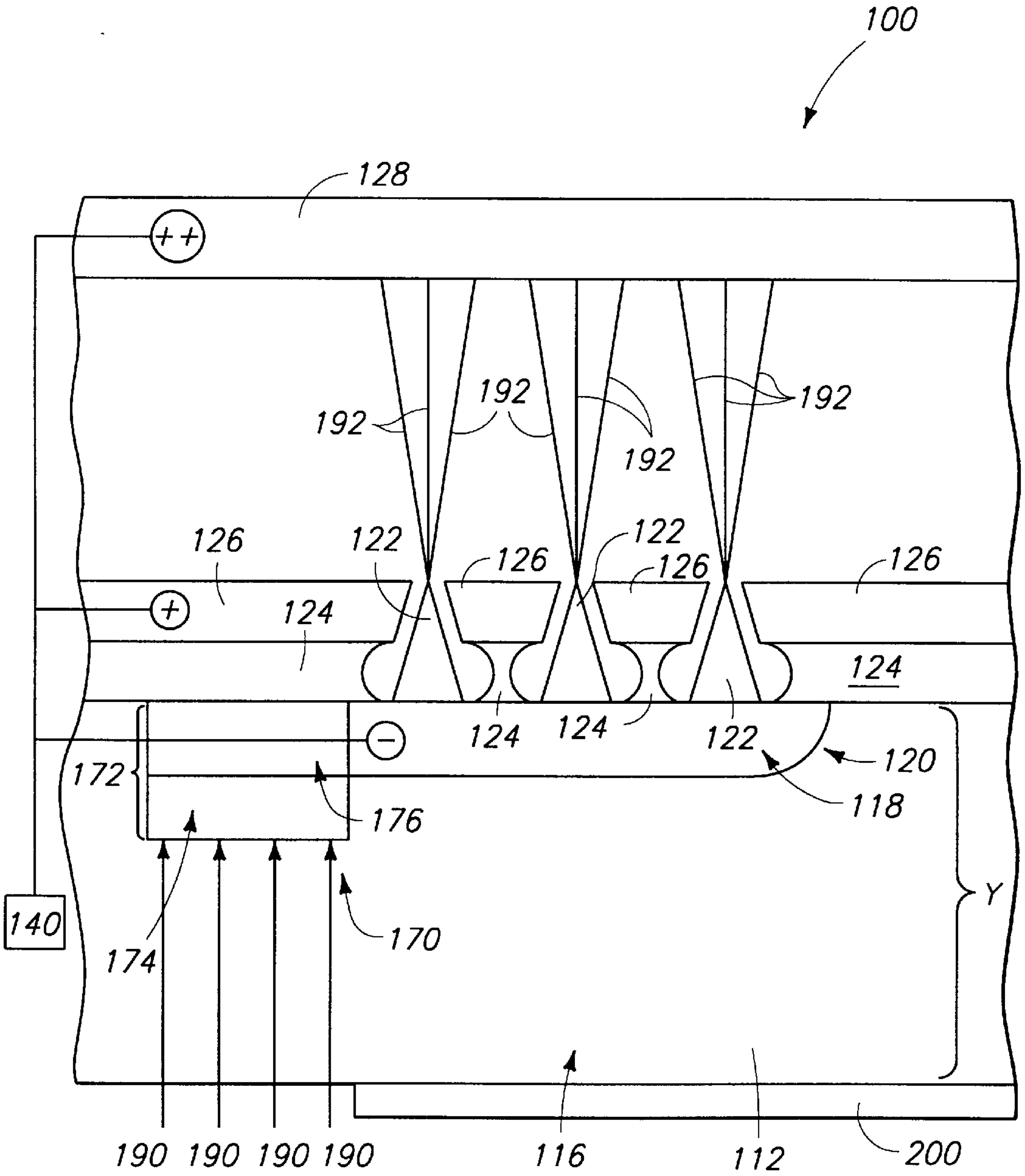
FIG. 3 is a diagrammatic, fragmentary, schematic, cross-sectional view of a third embodiment apparatus encompassed by the present invention.

FIG. 3 illustrates an alternative embodiment of the apparatus 100 of FIG. 2. The embodiment of FIG. 3 differs from that of FIG. 2 in that a light-blocking material 200 is provided to prevent light from reaching diode 120. Material 200 can comprise, for example, a metal (such as, for example, tungsten or aluminum) or amorphous silicon. In particular applications in which only relatively long wavelength light (greater than or equal to about 2500 nanometers) is desired to be detected, material 200 can advantageously preclude light of relatively short wavelengths (less than or equal to about 1200 nanometers) from reaching diode 120 and causing spurious signals.

Figure 4:
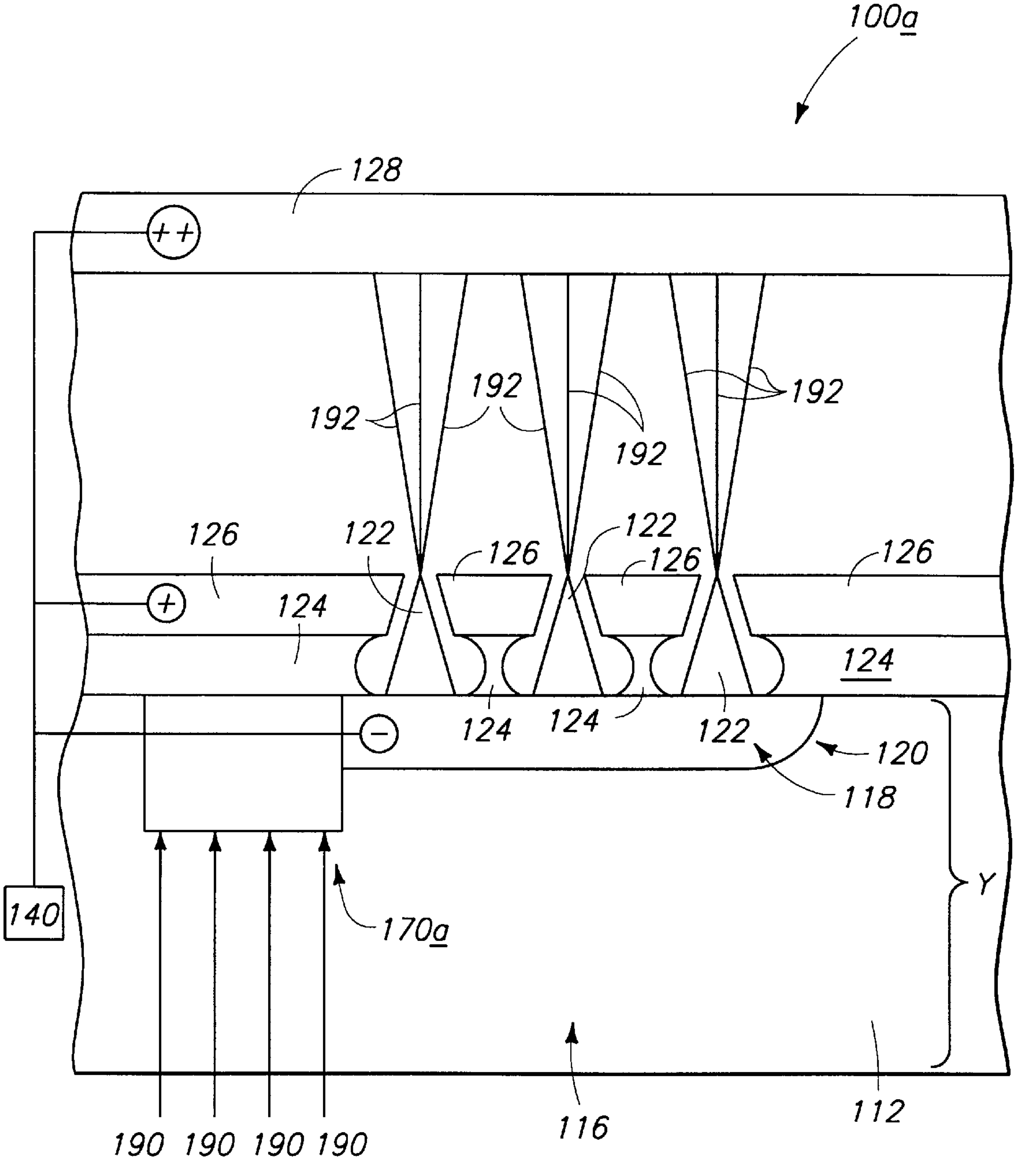
FIG. 4 is a diagrammatic, fragmentary, schematic, cross-sectional view of a fourth embodiment apparatus encompassed by the present invention.

FIG. 4 illustrates an alternate embodiment 100a of the present invention. In referring to FIG. 4, identical numbering to that utilized in describing FIG. 2 is used, with differences indicated by the suffix "a". FIG. 4 is identical to FIG. 2 in all respects except that receptor 170 of FIG. 2 is replaced with a receptor **170*a* that comprises an electrical component sensitive to infrared radiation, such as, for example, a bolometer, with such electrical component being in electrical connection with one or both of p-type doped region 116 and n-type doped region 118**.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A cathode emitter device, comprising:

an infrared receptor encompassing a first material, the first material including an n-type doped region overlying a p-type doped region; the n-type and p-type doped regions of the receptor joining at a junction diode;

an array of cathode emitter tips in electrical connection with the n-type region of the infrared receptor; and a second material electrically between the first material and the emitter tips; the second material comprising an n-type doped region and a p-type doped region; the n-type doped region of the second material physically contacting the n-type doped region of the first material and the p-type doped region of the second material physically contacting the p-type doped region of the first material; the second material being silicon.

2. The cathode emitter device of claim 1 wherein the first material comprises platinum silicide.

3. The cathode emitter device of claim 1 wherein the first material consists essentially of doped platinum silicide.

4. The cathode emitter device of claim 1 wherein the first material comprises Hg—Cd—Te.

5. The cathode emitter device of claim 1 wherein the first material consists essentially of doped Hg—Cd—Te.

6. A cathode emitter device, comprising:

a substrate comprising an n-type doped region overlying a p-type doped region; the n-type and p-type doped regions of the substrate physically contacting one another at an interface; the interface being a junction diode;

an array of cathode emitter tips in electrical connection with the junction diode; and a receptor assembly beside the junction diode, the receptor assembly comprising a material different from that of the substrate, and comprising a p-type doped region and n-type doped region of said material different than the substrate; the p-type doped region of the receptor assembly electrically contacting the p-type doped region of the substrate, and the n-type doped region of the receptor assembly electrically contacting the n-type doped region of the substrate.

7. The cathode emitter device of claim 1 wherein the p-type doped region of the receptor assembly physically contacts the p-type doped region of the substrate, and wherein the n-type doped region of the receptor assembly physically contacts the n-type doped region of the substrate.

8. The cathode emitter device of claim 6 further comprising an infrared blocking material beneath the junction diode and not beneath the receptor.

9. The cathode emitter device of claim 8 wherein the infrared blocking material comprises one or more materials selected from the group consisting of tungsten, aluminum and amorphous silicon.

10. The cathode emitter device of claim 6 wherein the receptor assembly material comprises platinum silicide and wherein the substrate comprises silicon.

11. The cathode emitter device of claim 6 wherein the receptor assembly material comprises platinum silicide and wherein the substrate comprises monocrystalline silicon.

12. The cathode emitter device of claim 6 wherein the receptor assembly material comprises platinum silicide and wherein the substrate comprises polycrystalline silicon.

13. The cathode emitter device of claim 6 wherein the receptor assembly material comprises Hg—Cd—Te and wherein the substrate comprises silicon.

14. The cathode emitter device of claim 6 wherein the receptor assembly material comprises Hg—Cd—Te and wherein the substrate comprises monocrystalline silicon.

15. The cathode emitter device of claim 6 wherein the receptor assembly material comprises Hg—Cd—Te and wherein the substrate comprises polycrystalline silicon.

16. A cathode emitter device, comprising:

a substrate comprising an n-type doped region overlying a p-type doped region; the n-type and p-type doped regions of the substrate joining at an interface; the interface being a junction diode;

an array of cathode emitter tips formed in electrical connection with the junction diode; and a receptor assembly in electrical connection with the at least one of the n-type doped region or p-type doped region of the substrate; the receptor assembly and p-type doped region having electrical characteristics, the electrical characteristics of the receptor assembly being more readily altered by light having a wavelength of about 2500 nanometers or greater than are the electrical characteristics of one or both of the n-type doped region and the p-type doped region of the substrate.

17. The cathode emitter device of claim 16 wherein the receptor assembly comprises a material different than the substrate, and further comprises n-type doped and p-type doped regions within the material.

18. The cathode emitter device of claim 17 wherein the receptor assembly material comprises platinum silicide.

19. The cathode emitter device of claim 17 wherein the receptor assembly material comprises Hg—Cd—Te.

20. The cathode emitter device of claim 16 wherein the receptor assembly comprises an electrical component.

21. The cathode emitter device of claim 16 wherein the receptor assembly comprises a bolometer.

22. A cathode emitter device, comprising:

a substrate comprising a semiconductive material; the semiconductive material comprising an n-type doped region overlying a p-type doped region; the n-type and p-type doped regions of the semiconductive material physically contacting one another at an interface;

an array of cathode emitter tips formed in electrical connection with the n-type doped region of the semiconductive material; and a second material in electrical contact with the semiconductive material p-type doped region; the second material and doped semiconductive material having electrical characteristics, the electrical characteristics of the second material being more readily altered by light having a wavelength of at least about 2500 nanometers or greater than are the electrical characteristics of the doped semiconductive material.

23. The cathode emitter device of claim 22 wherein the substrate comprises monocrystalline silicon having a thickness of less than or equal to about 10 microns.

24. The cathode emitter device of claim 22 wherein the second material comprises platinum silicide.

25. The cathode emitter device of claim 22 wherein the second material consists essentially of doped platinum silicide.

26. The cathode emitter device of claim 22 wherein the second material comprises Hg—Cd—Te.

27. The cathode emitter device of claim 22 wherein the second is material consists essentially of doped Hg—Cd—Te.

28. The cathode emitter device of claim 22 wherein the second material comprises an electrical component.

29. The cathode emitter device of claim 22 wherein the second material comprises a bolometer.

30. A field emission display device, comprising:

a substrate comprising an n-type doped region overlying a p-type doped region; the n-type and p-type doped regions of the substrate joining at an interface; the interface being a junction diode;

an array of cathode emitter tips formed in electrical connection with the junction diode; and a receptor assembly beside the junction diode, the receptor assembly comprising a material different from that of the substrate, and comprising a p-type doped region and n-type doped region of said material different than the substrate; the p-type doped region of the receptor assembly contacting the p-type doped region of the substrate, and the n-type doped region of the receptor assembly contacting the n-type doped region of the substrate; and a phosphor-coated plate spaced from the cathode emitter tips.

31. The device of claim 30 wherein the receptor assembly material comprises platinum silicide and wherein the substrate comprises silicon.

32. The device of claim 30 wherein the receptor assembly material comprises platinum silicide and wherein the substrate comprises monocrystalline silicon.

33. The device of claim 30 wherein the receptor assembly material comprises platinum silicide and wherein the substrate comprises polycrystalline silicon.

34. The device of claim 30 wherein the receptor assembly material comprises Hg—Cd—Te and wherein the substrate comprises silicon.

35. A field emission display device, comprising:

a first material comprising an n-type doped region overlying a p-type doped region; the n-type and p-type doped regions joining at an interface;

an array of cathode emitter tips formed in electrical connection with the n-type doped region; wherein the p-type doped region has electrical characteristics which are more readily altered by light having a wavelength of about 2500 nanometers or greater than are the electrical characteristics of p-type doped silicon;

a phosphor-coated plate spaced from the cathode emitter tips; and a second material electrically between the first material and the emitter tips; the second material comprising an n-type doped region and a p-type doped region; the n-type doped region of the second material physically contacting the n-type doped region of the first material and the f-type doped region of the second material physically contacting the p-type doped region of the first material; the second material comprising silicon.

36. The device of claim 35 wherein the first material comprises platinum silicide.

37. The device of claim 35 wherein the first material consists essentially of doped platinum silicide.

38. The device of claim 35 wherein the first material comprises Hg—Cd—Te.

39. The device of claim 35 wherein the first material consists essentially of doped Hg—Cd—Te.

40. A method of detecting light, comprising:

forming an emitter assembly in electrical connection with a p-n diode; the p-n diode being within a first material, the first material not being monocrystalline silicon or polycrystalline silicon; the first material having electrical characteristics which are more readily altered by the light than are the electrical characteristics of a p-n diode within monocrystalline silicon or polycrystalline silicon;

providing a phosphor spaced from the emitter assembly;

stimulating the An diode with light and thereby causing at least one electron to be emitted from the emitter assembly and toward the phosphor, the emitted electron striking the phosphor to cause an Image indicating the presence of the light; and providing a second material electrically between the first material and the emitter tips; the second material comprising an n-type doped region and a p-type doped region; the n-type doped region of the second material physically contacting the n-type doped region of the first material and the p-type doped region of the second material physically contacting the p-type doped region of the first material; the second material comprising silicon.

41. The method of claim 40 wherein the first material comprises platinum silicide.

42. The method of claim 40 wherein the material consists essentially of doped platinum silicide.

43. The method of claim 40 wherein the first material comprises Hg—Cd—Te.

44. The method of claim 40 wherein the first material consists essentially of doped Hg—Cd—Te.

45. A method of detecting light having a wavelength of at least about 2500 nanometers, comprising:

forming an emitter assembly in electrical connection with a p-n diode; the p-n diode being within a silicon substrate; the p-n diode having electrical characteristics;

forming a receptor in electrical connection with the An diode; the receptor having electrical characteristics that are more sensitive to light having a wavelength greater than about 2500 nanometers than are the electrical characteristics of the p-n diode;

providing a phosphor spaced from the emitter assembly;

stimulating the receptor with light having a wavelength of at least about 2500 nanometers, the stimulating altering electrical characteristics of the receptor;

changing the electrical characteristics of the p-n diode through the alteration in the electrical characteristics of the receptor and causing at least one electron to be emitted from the emitter assembly and toward the phosphor, the emitted electron striking the phosphor to cause an image indicating the presence of the light having a wavelength greater than about 2500 nanometers.

46. The method of claim 45 further comprising providing a blocking material between the p-n diode and the light to prevent light from reaching the p-n diode.

47. The method of claim 46 wherein the blocking material comprises a material selected from the group consisting of tungsten, aluminum, and amorphous silicon.

48. The method of claim 45 wherein the silicon substrate is a monocrystalline silicon material having the emitters formed over an upper surface, and having a thickness of less than about 10 microns between the upper surface and an opposing lower surface.

49. The method of claim 45 wherein the receptor assembly comprises a material different than the substrate, and further comprises n-type doped and p-type doped regions within the material.

50. The method of claim 49 wherein the receptor assembly material comprises platinum silicide.

51. The method of claim 49 wherein the receptor assembly material comprises Hg—Cd—Te.

52. The method of claim 45 wherein the receptor assembly comprises an electrical component.

53. The method of claim 45 wherein the receptor assembly comprises a bolometer.

* * * * *

UNITED STATES PATENT AND TRADEMARK OFFICE

CERTIFICATE OF CORRECTION

PATENT NO. : 6,441,542 B1 Page 1 of 1
DATED : August 27, 2002
INVENTOR(S) : Hush et al.

It is certified that error appears in the above-identified patent and that said Letters Patent is hereby corrected as shown below:

Column 1,
Line 52, please replace “than about 1,200nanometers.” with -- than about 1,200 nanometers --

Column 3,
Line 52, please replace “impacts p-type do de portion” with -- impacts p-type doped portion --

Column 6,
Line 10, please replace “of claim 1 wherein” with -- of claim 6 wherein --

Column 8,
Line 14, please replace “and the f-type doped” with -- and the p-type doped --
Line 35, please replace “stimulating the An diode” with -- stimulating the p-n diode --
Line 38, please replace “to cause an Image” with -- to cause an image --
Line 63, please replace “connections with the An” with -- connections with the p-n --

Signed and Sealed this

Fifth Day of August, 2003

JAMES E. ROGAN
*Director of the United States Patent and Trademark Office*